(12) United States Patent  (10) Patent No.: US 7,653,328 B2
Igarashi et al.  (45) Date of Patent: Jan. 26, 2010

(54) IMAGE FORMING DEVICE CAPABLE OF CLOSING DOOR WITH HIGH ACCURACY

(75) Inventors: Hiroshi Igarashi, Nagoya (JP); Yoshiteru Hattori, Ichinomiya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 217 days.

(21) Appl. No.: 11/773,587

(22) Filed: Jul. 5, 2007

(65) Prior Publication Data

US 2008/0025001 A1 Jan. 31, 2008

(30) Foreign Application Priority Data

Jul. 26, 2006 (JP) ............... 2006-203612

(51) Int. Cl.
*G03G 21/00* (2006.01)
(52) U.S. Cl. ...................................... 399/124
(58) Field of Classification Search .................. 399/107, 399/110, 114, 124, 125, 152
See application file for complete search history.

(56) References Cited

U.S. PATENT DOCUMENTS

2006/0039718 A1* 2/2006 Yokoi ......................... 399/124
2007/0147882 A1* 6/2007 Igarashi ...................... 399/110

FOREIGN PATENT DOCUMENTS

| JP | 03-267226 | 11/1991 |
|---|---|---|
| JP | 05-035057 | 2/1993 |
| JP | 05-241383 | 9/1993 |
| JP | 07-092881 | 4/1995 |
| JP | 08-044131 | 2/1996 |
| JP | 2001-079739 | 3/2001 |
| JP | 2002-111243 | 4/2002 |
| JP | 2003-172977 | 6/2003 |
| JP | 2006053193 A * | 2/2006 |

* cited by examiner

*Primary Examiner*—David M Gray
*Assistant Examiner*—Gregory H Curran
(74) *Attorney, Agent, or Firm*—Banner & Witcoff, Ltd

(57) ABSTRACT

An image forming device includes a main body and a door. The main body is provided with first and second contacting parts and an abutting surface. When the door is closed, the first and second contacting parts contact a door frame of the door, thereby determining the horizontal position of the door with respect to the main body. Also a vertical positioning stopper formed to the door frame abuts the abutting surface from above, thereby determining the vertical position of the door with respect to the main body. Further, a reactive force generated at a lock mechanism and an urging force of a spring increase a pressure to contact areas of the door with the first and second contacting parts and the abutting surface.

7 Claims, 7 Drawing Sheets

IMAGE FORMING DEVICE CAPABLE OF CLOSING DOOR WITH HIGH ACCURACY

CROSS REFERENCE TO RELATED APPLICATIONS

This application claims priority from Japanese Patent Application No. 2006-203612 filed Jul. 26, 2006. The entire content of this priority application is incorporated herein by reference.

TECHNICAL FIELD

The invention relates to an image forming device.

BACKGROUND

A laser printer disclosed in Japanese Patent Application Publication No. HEI-3-267226, for example, includes a main casing and an image forming unit accommodated in the main casing. The image forming unit includes an exposure unit, a transfer unit, and a fixing unit. In order to remove a recording medium, such as a recording sheet or an OHP sheet, jammed in the laser printer, the main casing is normally formed with an opening for enabling to perform an maintenance operation and is provided with a door to the opening.

The door is normally attached to the main casing via a hinge mechanism so as to swing open and close. Since the hinge mechanism normally has a relatively large mechanical play, the door is easily displaced from a predetermined position of the main casing when closed.

In this case, a large level difference occurs between outer surfaces of the main casing and the closed door, thereby degrading the external appearance of the laser printer.

SUMMARY

In view of the foregoing, it is an object of the invention to provide an image forming device capable of positioning a door relative to a main casing with high accuracy.

In order to attain the above and other objects, the invention provides an image forming device including an image forming unit that forms an image on a recording medium, a main body that accommodates the image forming unit and that is formed with an opening, a hinge mechanism, a door that is pivotably attached to the main body via the hinge mechanism, and an biasing member that biases the door. The door is pivotable to open and close over the opening formed in the main body, and the door is formed with a vertical positioning member. The main body includes a first positioning member that contacts a first predetermined position of the door from a horizontal direction, thereby positioning the door relative to the main body, a second positioning member that contacts a second predetermined position of the door from the horizontal direction, thereby positioning the door relative to the main body, and a third positioning member that contacts the vertical positioning member from a vertical direction, thereby positioning the door relative to the main body. The second predetermined position is on the opposite side of the first predetermined position from the hinge mechanism. The biasing member biases the door in a direction to increase a pressure to contact areas of the door with the first to third positioning members.

BRIEF DESCRIPTION OF THE DRAWINGS

Illustrative embodiments in accordance with the invention will be described in detail with reference to the following figures wherein.

DETAILED DESCRIPTION

A laser printer (electrophotographic image forming device) according to an embodiment of the invention will be described while referring to the accompanying drawings. Note that in the following description, the expressions "front," "rear," "left," "right," "above," "below," "upper," and "lower" are used to define the various parts when the laser printer is disposed in an orientation in which it is intended to be used.

Figure 1:
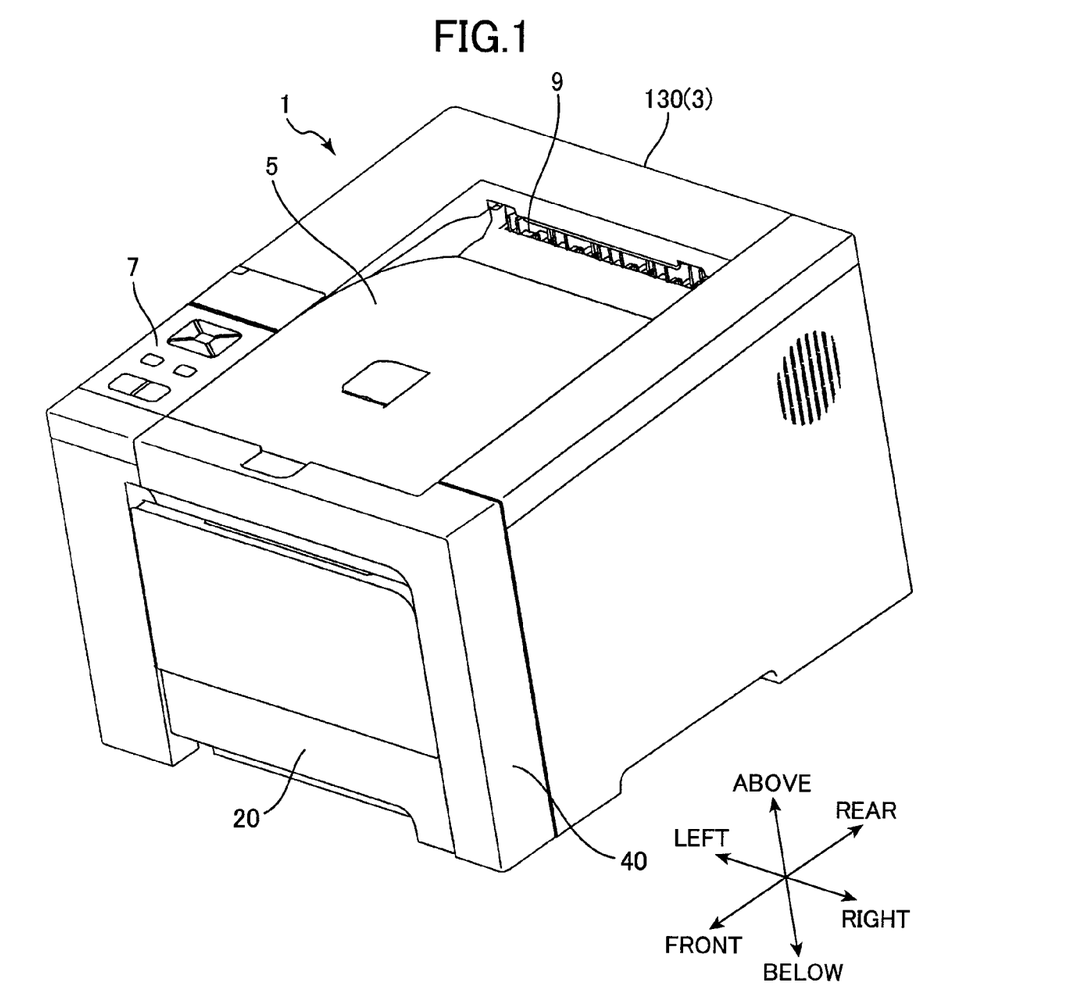
FIG. 1 is a perspective view showing the external appearance of a laser printer according to an embodiment of the invention.

As shown in FIG. 1, a laser printer 1 according to the present embodiment includes a main body 130, a discharge tray 5 formed on top of the main body 130, and an operation panel 7 disposed on top of the main body 130. The discharge tray 5 is for receiving a recording medium, such as a recording sheet, having an image formed thereon, and is formed with a discharge slit 9 at the rear end for discharging the recording medium. The operation panel 7 is for inputting various settings of and operating the laser printer 1.

Figure 2:
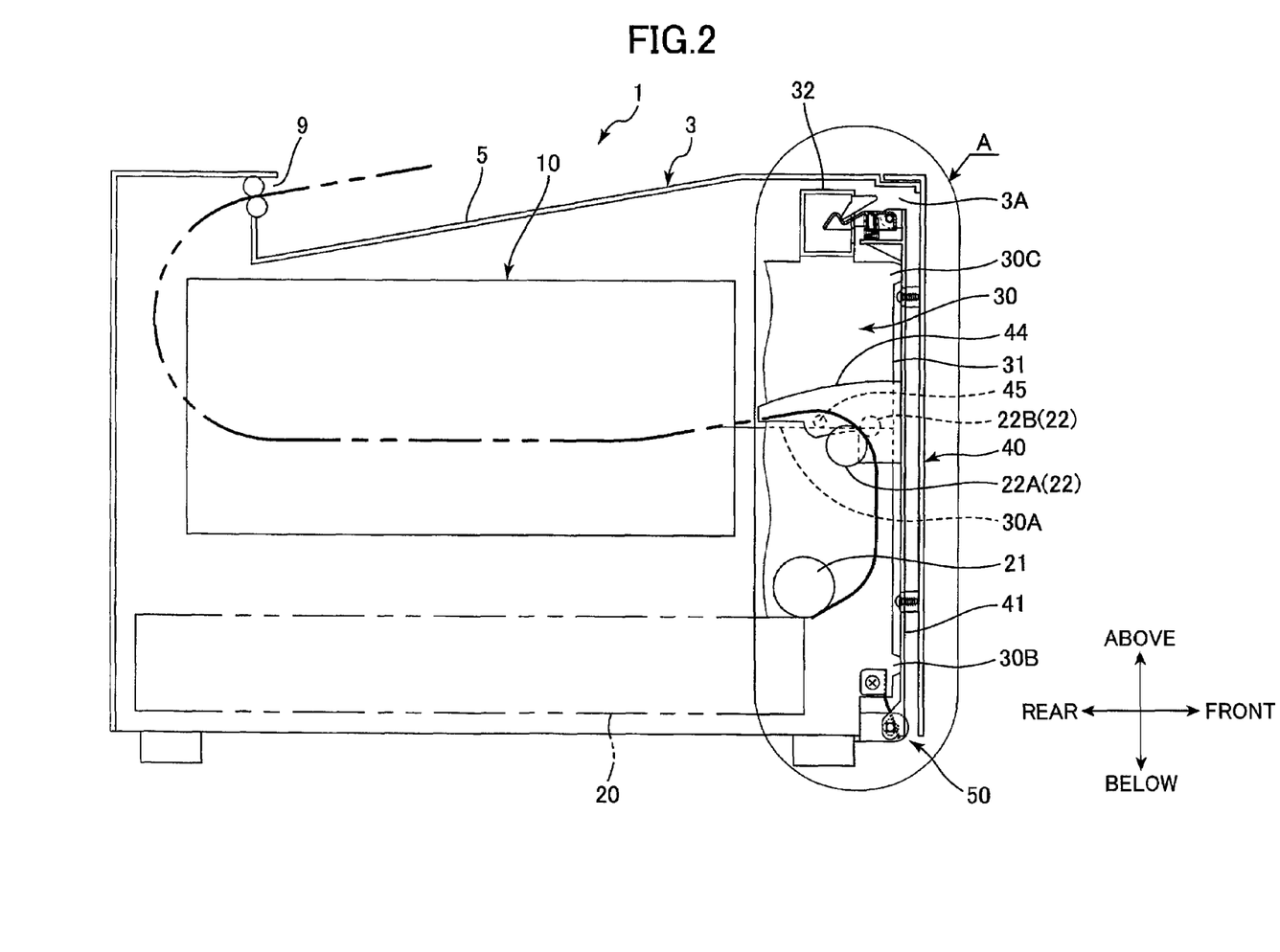
FIG. 2 is a vertical cross-sectional view of the laser printer of FIG. 1 with a door being closed.

As shown in FIG. 2, the main body 130 includes a main casing 3 and a frame 30 covered with the main casing 3. The laser printer 1 further includes, within the main casing 3, an electrophotographic image forming unit 10 and a sheet feed tray 20 for supporting a stack of recording medium. The image forming unit 10 and the sheet feed tray 20 are detachably attached to the frame 30.

The image forming unit 10 is for forming images on the recording medium conveyed from the sheet feed tray 20. Although not shown in the drawings, the image forming unit 10 includes a process cartridge, an exposure unit, a transfer unit, and a fixing unit. The process cartridge is disposed above the sheet feed tray 20 and includes a photosensitive drum and a developer cartridge accommodating developer (toner) therein. The exposure unit is disposed at the upper section of the process cartridge and exposes the photosensitive drum to light so as to form an electrostatic latent image thereon. The transfer unit is disposed in opposition to the photosensitive drum and transfers developer images formed on the photosensitive drum onto the recording medium. The fixing unit is for thermally fixing the developer images onto the recording medium.

The frame 30 includes plate-like side frames 31 provided on the left and right sides in a width direction orthogonal to a conveying direction in which the recording medium is conveyed, a top board (not shown) which connects the top ends of the side frames 31, and a square pipe-like reinforcing member 32 disposed to the upper front section of the frame 30 for connecting the side frames 31. Each side frame 31 has an abutment surface 30A.

The reinforcing member 32 and the top board are made of metal such as a cold rolled steel plate (SPCC). A main part of the side frames 31 is formed of a resin having an excellent mechanical strength such as ABS or polymer alloy, and reinforced with a metal plate such as SPCC. The side frames 31, the reinforcing member 32, and the top board are mechanically connected and fixed to each other with P-screws (not shown) or the like.

Figure 3:
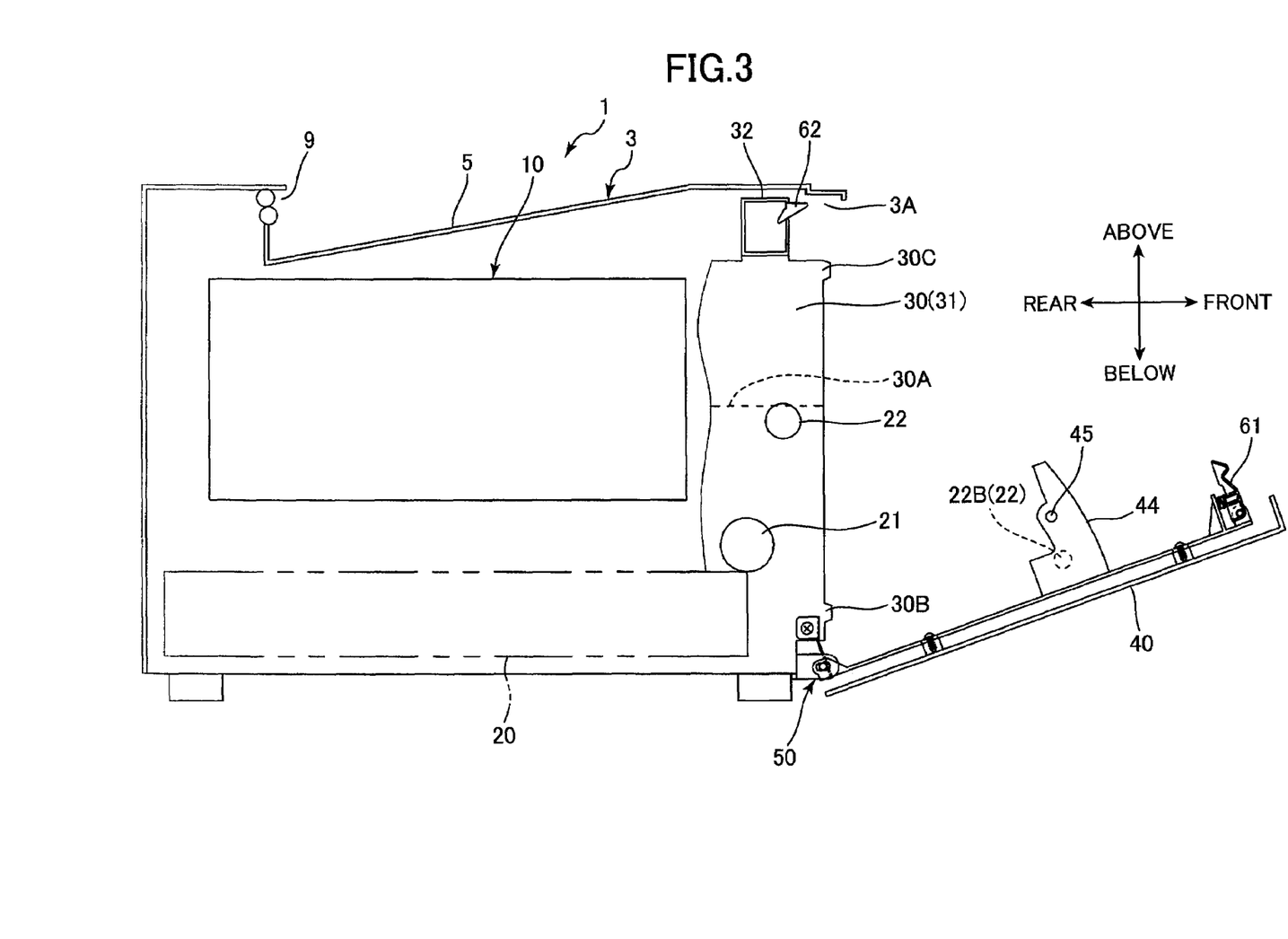
FIG. 3 is a vertical cross-sectional view of the laser printer of FIG. 1 with the door being opened.

The main casing 3 is formed with an opening 3A at the front end for enabling a user to attach or remove the process cartridge of the image forming unit 10 and to remove a recording medium jammed in the main casing 3. A door 40 is attached to either the main casing 3 or the frame 30 via a hinge mechanism 50 so as to swing open and close over the opening 3A, as shown in FIGS. 2 and 3.

A first contacting part 30B, i.e. a first positioning member, is provided on the front bottom section of each side frame 31. A second contacting part 30C, i.e. a second positioning member, is provided on the front upper section of each side frame 31.

As shown in FIG. 2, a feed roller 21 is disposed above the sheet feed tray 20, and a guide mechanism 22 is disposed above the feed roller 21. The feed roller 21 is for feeding the recording medium stacked on the sheet feed tray 20. The recording medium fed by the feed roller 21 is guided by a guide roller or other guide member (not shown) so that the conveying direction of the recording medium is changed by approximately 90 degrees to the upward direction. Subsequently, the recording medium is guided by the guide mechanism 22 so that the conveying direction is changed by approximately 90 degrees to the horizontal direction, and then supplied to the image forming unit 10.

The guide mechanism 22 includes a pair of rollers 22A and 22B that conveys the recording medium while sandwiching the same therebetween. The roller 22A is rotatably attached to the frame 30 and driven to rotate when a driving force from an electric motor or other driving source (not shown) is input.

The roller 22B is rotatably attached to the door 40 and contacts the roller 22A when the door 40 is closed. Thus, the recording medium fed from the sheet feed tray 20 is pressed against the roller 22A by the roller 22B.

Figure 4:
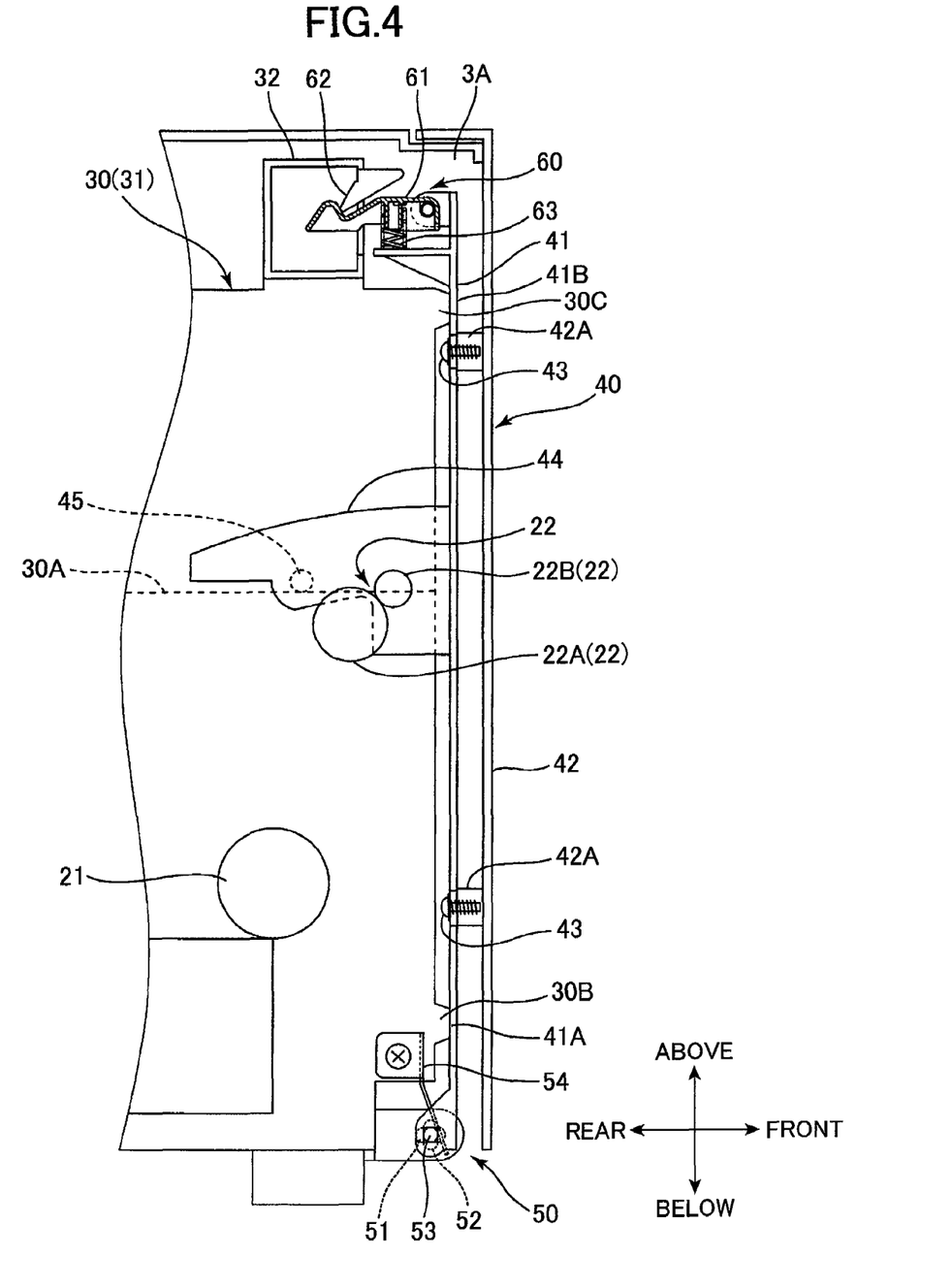
FIG. 4 is an enlarged view showing a part of the laser printer indicated by an arrow A in FIG. 2.

As shown in FIG. 4, the door 40 includes a door frame 41 and a door cover 42 which covers outside the door frame 41. Bosses 42A are formed to inwardly protrude from the door cover 42, and the door frame 41 is mechanically fixed to the bosses 42A with P-screws 43 or the like, so as to be integrated with the door cover 42.

An arm 44 is formed integrally with the door frame 41 for rotatably supporting the roller 22B. The arm 44 is provided with vertical positioning stoppers 45, i.e. vertical positioning members, that contact the abutment surfaces 30A, i.e. a third positioning member, of the side frames 31 from above.

The vertical positioning stoppers 45 are provided at both left and right ends of the door 40 in the width direction, and each has a curved surface that contacts the abutment surface 30A. In the present embodiment, the vertical positioning stoppers 45 and the arm 44 are formed of a resin integrally with each other.

The abutment surfaces 30A extend substantially in the horizontal direction orthogonal to the vertical direction. The abutment surfaces 30A contact the vertical positioning stoppers 45 from bottom in the vertical direction so as to determine the vertical position of the door 40 relative to the frame 30 (main casing 3).

As shown in FIG. 4, the first contacting part 30B of the frame 30 contacts a first position 41A of the door frame 41 near the hinge mechanism 50 from the horizontal direction, so as to position the door 40 relative to the frame 30 (main casing 3). On the other hand, the second contacting part 30C contacts a second position 41B of the door frame 41 on the opposite side of the guide mechanism 22 from the hinge mechanism 50, from the horizontal direction, so as to position the door 40 relative to the frame 30 (main casing 3).

Figure 5:
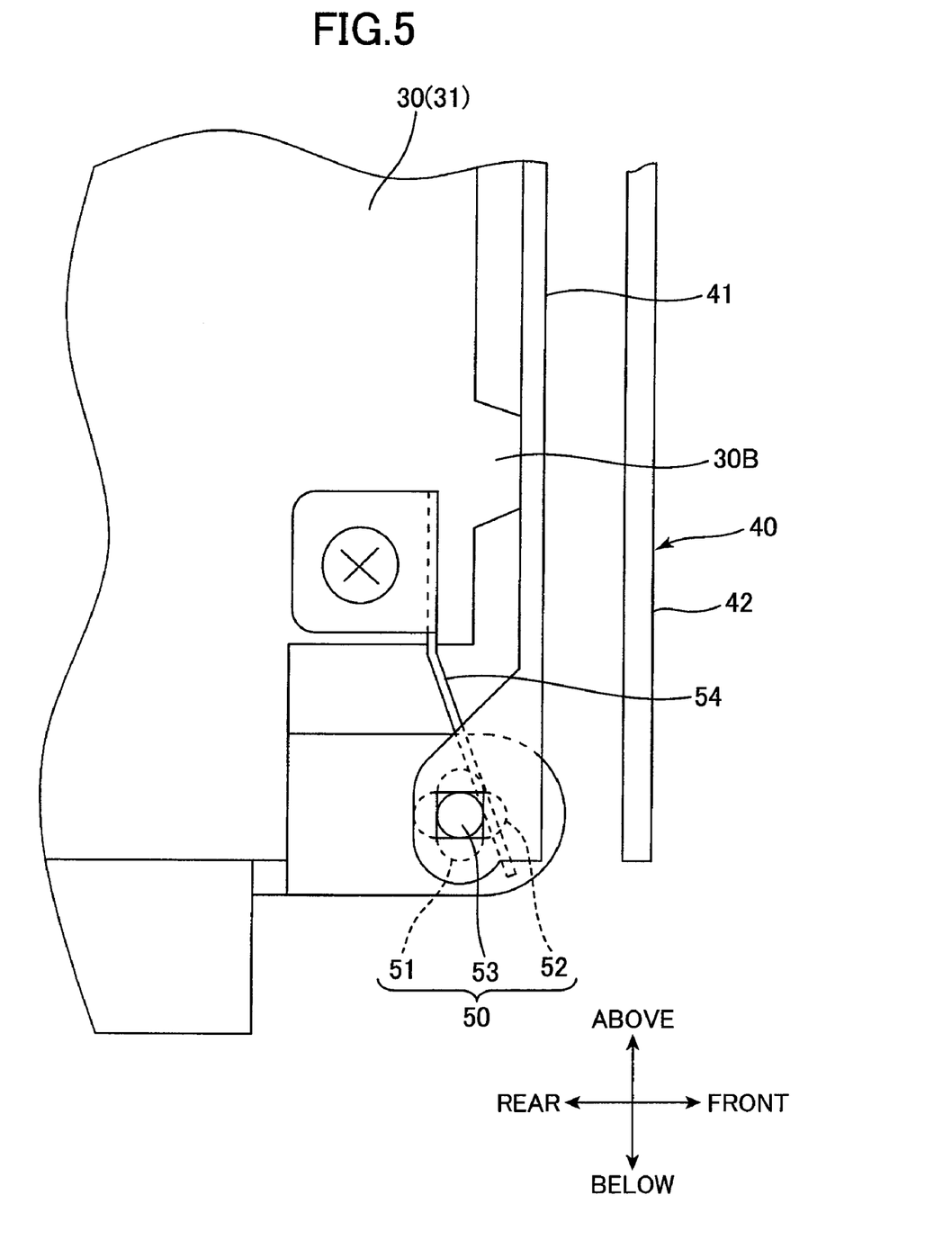
FIG. 5 is an enlarged view of a hinge mechanism of the laser printer according to the embodiment of the invention.
Figure 6:
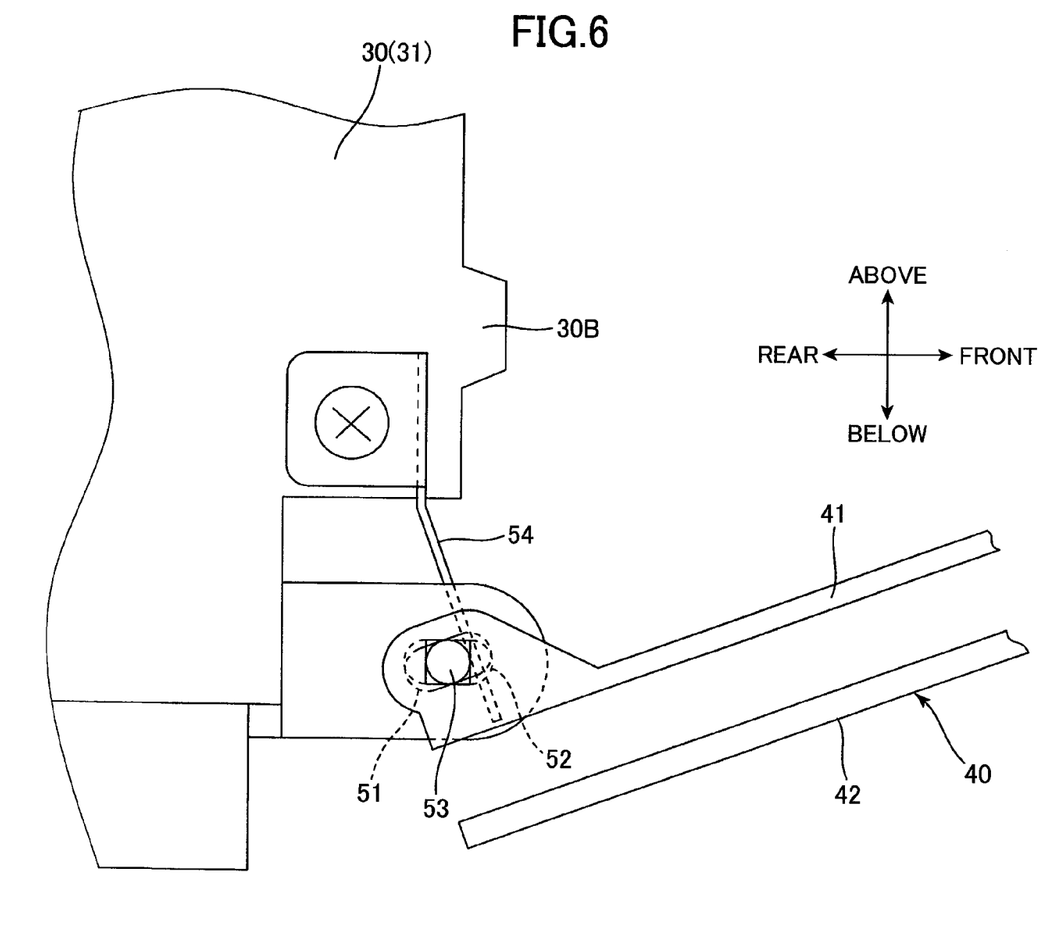
FIG. 6 is an enlarged view of the hinge mechanism when the door is open.

As shown in FIGS. 5 and 6, the hinge mechanism 50 includes a door-side elongated hole 51 formed through the door frame 41, a body-side elongated hole 52 formed through either the frame 30 or the main casing 3, and a shaft 53 slidably and rotatably fitted into the elongated holes 51 and 52.

Although not shown in the drawings, an umbrella-shaped flange having a diameter larger than minor axes of the elongated holes 51 and 52 is provided on one longitudinal end of the shaft 53, and a flat washer having a diameter larger than the minor axes of the elongated holes 51 and 52 is attached to the other longitudinal end of the shaft 53, so as to prevent the shaft 53 from dropping off from the elongated holes 51 and 52.

The body-side elongated hole 52 is formed so that its major axis extends substantially in the horizontal direction. The door-side elongated hole 51 is formed so that its major axis extends in a direction substantially orthogonal to the direction in which the major axis of the body-side elongated hole 52 extends, as viewed from the axis direction of the shaft 53 (near to far direction in FIG. 4), when the door 40 is closed as shown in FIG. 5. That is, when the door 40 is closed, the major axis of the body-side elongated hole 52 extends substantially in the vertical direction. It should be noted that the door-side elongated hole 51 and the body-side elongated hole 52 are configured to allow the shaft 53 inserted therein to slightly shift both in the vertical and horizontal directions even when the door 40 is closed. In other words, the hinge mechanism 50 has a mechanical play.

On the other hand, as shown in FIG. 6, when the door 40 is opened to a substantially horizontal position, the major axes of both the door-side elongated hole 51 and the body-side elongated hole 52 extend substantially in the horizontal direction.

As shown in FIG. 4, a leaf spring 54 is disposed near the hinge mechanism 50. The leaf spring 54 is fixed to the frame 30 (main casing 3) with a P-screw or the like at its fixed point and exerts an elastic force to pull the shaft 53 rearward. As a result, an elastic force is exerted on the door 40 in a direction to increase the pressure to contact areas of the door frame 41 with the first and second contacting parts 30B and 30C.

That is, as the elastic force of the leaf spring 54 pulls the shaft 53 rearward, the door (door frame 41) is pulled rearward. However, in a state that the door 40 is closed, the major axis of the door-side elongated hole 51 extends substantially in the vertical direction, so that the horizontal movement of the shaft 53 relative to the door-side elongated hole 51 is restricted. This increases the pressure to the contact areas of the door 40 (door frame 41) with the first and second contacting parts 30B and 30C.

Figure 7:
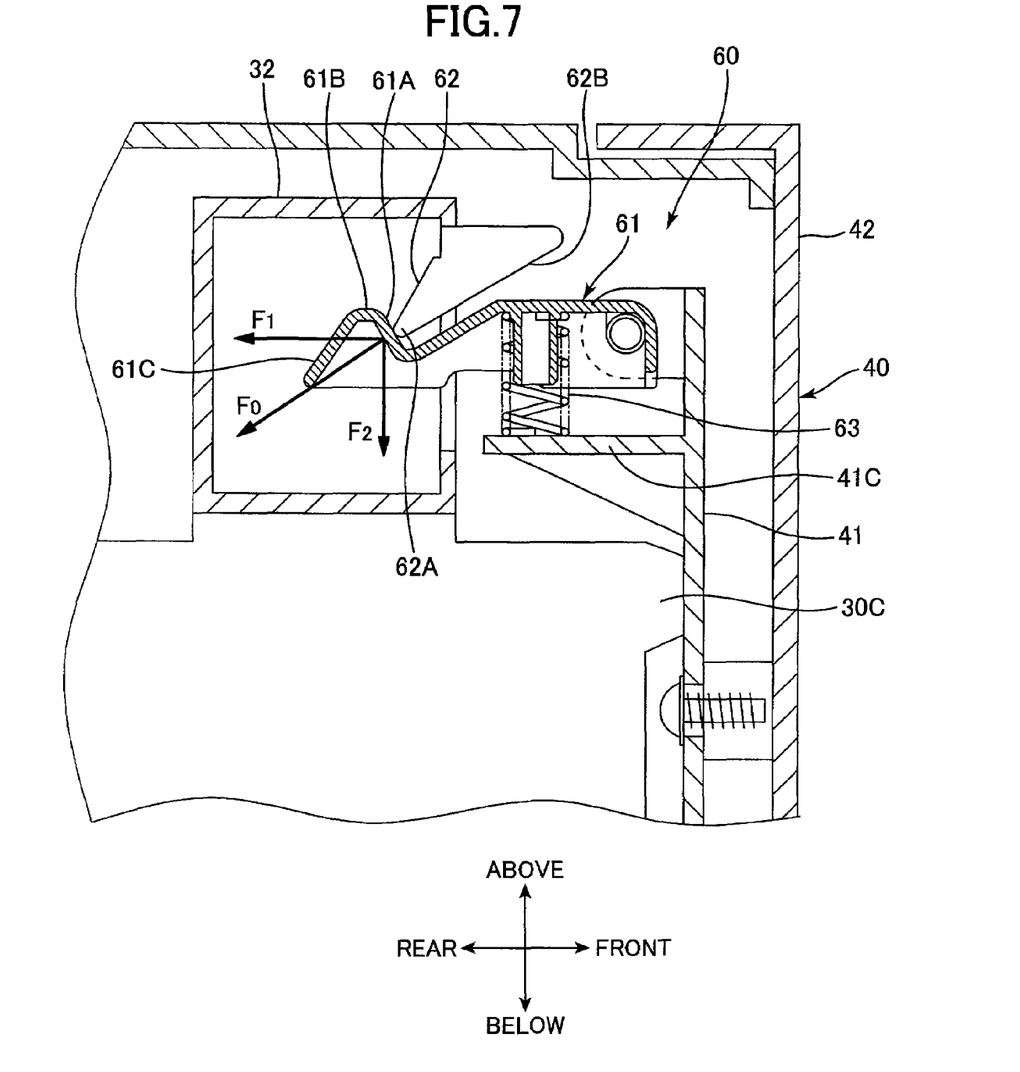
FIG. 7 is an enlarged view of a lock mechanism of the laser printer according to the embodiment of the invention.

As shown in FIG. 4, a lock mechanism 60 is disposed in the upper portion of the opening 3A, that is, on the opposite side of the guide mechanism 22 from the hinge mechanism 50. As shown in FIG. 7, the lock mechanism 60 includes a hook-like engaging arm 61 provided to the door 40 and an engaging protrusion 62 provided to the frame 30 (main casing 3). The engaging arm 61 engages with the engaging protrusion 62 so as to maintain the closed state of the door 40.

More specifically, the engaging arm 61 is supported in the door frame 41 so as to be pivotable upward and downward about its base end located at the front side and extends rearward from the base end. A free end portion of the engaging arm 64 is formed with a convex portion 61B having a sloped surface 61A and a guide surface 61C.

The sloped surface 61A slants upward to the rear at a slanting angle of approximately 45 degrees. The guide surface 61C is disposed rearward of the sloped surface 61A, and slants downward to the rear.

The engaging protrusion 62 is positioned above the sloped surface 61A and contacts the sloped surface 61A from above when the door 40 is closed, thereby engaging with the convex portion 61B of the engaging arm 61. The engaging protrusion 62 has a tip end 62A that contacts the sloped surface 61A and a guide surface 62B that extends forward from the tip end 62A and that slants upward to the front. The guide surface 61C of the engaging arm 61 slidingly contacts the guide surface 62B in the process of engaging the engaging arm 61 with the engaging protrusion 62 as the door 40 is closed.

A coil spring 63 is disposed between a support member 41C of the door frame 41 and the engaging arm 61 so as to biasing the engaging arm 61 upward. In other words, the coil spring 63 exerts an elastic force on the engaging arm 61 in a direction to increase the pressure between the sloped surface 61A and the engaging protrusion 62. In this embodiment, the elastic force of the coil spring 63 is exerted on the engaging arm 61 at a position frontward of the contacting point between the sloped surface 61A and the engaging protrusion 62.

With this configuration, when the engaging arm 61 and the engaging protrusion 62 are in engagement with each other, the engaging arm 61 exerts a horizontal component $F_1$ and a vertical component $F_2$ of a reactive force $F_0$ received from the engaging protrusion 62, on the door frame 41 (door 40). The horizontal component $F_1$ increases the pressure to the contact areas of the door 40 (door frame 41) with the first and second contacting parts 30B and 30C. The vertical component $F_2$ and the gravity exerted on the door 40 increase the pressure to contact areas of the vertical positioning stoppers 45 with the abutment surfaces 30A.

As described above, the horizontal position of the door 40 relative to the frame 30 is determined by the first and second contacting parts 30B and 30C, and the vertical position thereof is determined by the abutment surfaces 30A. Since the horizontal and vertical components $F_1$ and $F_2$ are exerted on the door 40 in the directions to increase the pressure to the contact areas of the door 40 with the first and second contacting parts 30B and 30C and the abutment surfaces 30A, the door 40 can be reliably and properly positioned relative to the frame 30.

Here, it is conceivable to employ only the second contacting part 30C and the abutment surfaces 30A without the first contacting part 30B. In this case, it is possible to accurately position the door 40 with respect to the frame 30 at a position far from the hinge mechanism 50 (upper section). However, since the hinge mechanism 50 has a relatively large mechanical play as described above, it is difficult to position the door 40 with high accuracy at a position near the hinge mechanism 50 (bottom section) due to the mechanical play of the hinge mechanism 50. This leads to the danger that the bottom section of the door 40 near the hinge mechanism 50 rattles when the door 40 is closed.

However, according to the present embodiment, since there are provided both the first contacting part 30B disposed near the hinge mechanism 50 and the second contacting part 30C disposed far from the hinge mechanism 50, it is possible to prevent the bottom section of the door 40 near the hinge mechanism 50 from rattling when the door 40 is closed. Therefore, the door 40 can be positioned relative to the frame 30 and the main casing 3 with high accuracy.

As described above, the roller 22B is attached to the door frame 41. Therefore, if the door frame 41 is positioned relative to the frame 30 with a lower accuracy, the position of the roller 22B deviates from a predetermined position relative to the frame 30, thereby preventing a smooth conveyance of a recording medium.

However, in the present embodiment, the door 40 is positioned relative to the frame 30 with high accuracy when the door 40 is closed as described above. This prevents the position of the roller 22B from largely deviating from the predetermined position relative to the frame 30, enabling to smoothly convey the recording medium.

Further, since the contacting parts 30B and 30C are provided on both sides of the roller 22B that requires the highest positional accuracy, the roller 22B can be positioned properly with high accuracy.

In the laser printer disclosed in Japanese Patent Application Publication No. HEI-3-267226, a feed roller is attached to the door via an elastic member so that the elastic member absorbs the positional deviation of the door relative to the main casing. However, with this construction, the elastic member is accommodated in the door, and thus the thickness of the door increases, thereby enlarging the size of the laser printer.

However, according to the present embodiment, since the roller 22B is integrally attached to the door frame 41 and since it is possible to position the door 40 relative to the frame 30 with high accuracy, it is unnecessary to provide, to the door 40, an elastic member for absorbing the positional deviation of the door frame 41 relative to the frame 30. Therefore, it is possible to prevent increase in the thickness of the door 40, thereby preventing upsizing of the laser printer 1.

If one or both of the frame 30 and the door frame 41 is deformed, it may be difficult to position the door frame 41 relative to the frame 30 with high accuracy.

In view of foregoing, according to the present embodiment, the rigidity of the door 40, that is the rigidity of the door frame 41 is set lower than the rigidity of the frame 30 so that the door 40 easily deforms along the shape of the frame 30 when the door 40 is closed. Therefore, even if the door 40 or the frame 30 is distorted to some extent, the door 40 can be positioned relative to the frame 30 with high accuracy.

Also, when the door 40 is opened to the substantially horizontal position, the major axes of the door-side elongated hole 51 and the body-side elongated hole 52 extend relatively in the horizontal direction as shown in FIG. 6. This prevents the door 40 from rattling or largely moving in the vertical direction. Therefore, a user hardly feels that the door 40 is loose when the door 40 is opened, thereby improving the usability perceived by the user when the door 40 is opened.

On the other hand, when the door 40 is closed, the major axis of the door-side elongated hole 51 extends in a direction substantially perpendicular to a direction in which the major axis of the body-side elongated hole 52 extends. Here, as described above, the door-side elongated hole 51 and the body-side elongated hole 52 are configured to allow the shaft 53 inserted therein to slightly shift both in the vertical and horizontal directions when the door 40 is closed. This allows the door 40 to absorb the assembling and size variations of the door 40 relative to the frame 30 (especially variations in the distance between the hinge mechanism 50 and the vertical positioning stoppers 45) when the door 40 is closed. Therefore, the door 40 can be reliably brought into contact with the first and second contacting parts 30B and 30C and the abutment surfaces 30A and positioned relative to the frame 30 with high accuracy.

While the invention has been described in detail with reference to the above embodiment thereof, it would be apparent to those skilled in the art that various changes and modifications may be made therein without departing from the spirit of the invention.

For example, the frame 30 of the above-described embodiment is provided with the first contacting part 30B, the second contacting part 30C, and the abutment surface 30A. However, the first contacting part 30B, the second contacting part 30C, and the abutment surface 30A may be provided to the main casing 3 instead.

In the above-described embodiment, the door frame 41 is formed separate from the door cover 42. However, the door frame 41 may be formed integrally with the door cover 42.

In the above-described embodiment, the horizontal component $F_1$ and the vertical component $F_2$ generated at the lock mechanism 60 are used to increase the pressure to the contact areas of the door frame 41 with the first and second parts 30B and 30C and the pressure to the contact areas of the vertical positioning stoppers 45 with the abutment surfaces 30A. However, the invention is not limited to this construction.

Although the rigidity of the door 40 of the above-described embodiment is lower than the rigidity of the frame 30, the invention is not limited to this configuration.

Also, according to the above-described embodiment, the door 40 is provided with the engaging arm 61, and the frame 30 is provided with the engaging protrusion 62. However, the engaging arm 61 may be provided to the frame 30, and the engaging protrusion 62 may be provided to the door 40.

In the above-described embodiment, the coil spring 63 is used for biasing the lock mechanism 60. However, a twisted coil spring may be used instead.

In the above-described embodiment, the major axis of the body-side elongated hole 52 extends substantially in the horizontal direction. However, the major axis of the body-side elongated hole 52 may extend substantially in the vertical direction.

What is claimed is:

1. An image forming device comprising:
   an image forming unit that forms an image on a recording medium;
   a main body that accommodates the image forming unit and that is formed with an opening;
   a hinge mechanism;
   a door that is pivotably attached to the main body via the hinge mechanism, the door being pivotable to open and close over the opening formed in the main body, the door being formed with a vertical positioning member; and
   a biasing member that biases the door; wherein:
   the main body includes:
      a first positioning member that contacts a first predetermined position of the door from a horizontal direction, thereby positioning the door relative to the main body;
      a second positioning member that contacts a second predetermined position of the door from the horizontal direction, thereby positioning the door relative to the main body, the first predetermined position being located between the second predetermined position and the hinge mechanism; and
      a third positioning member that contacts the vertical positioning member from a vertical direction, thereby positioning the door relative to the main body; and
   the biasing member biases the door in a direction to increase a pressure to predetermined positions of the door with the first to third positioning members, wherein:
   the hinge mechanism includes a first elongated hole formed through the door, a second elongated hole formed through the main body, and a shaft slidably and rotatably fitted into the first and second elongated holes;
   a major axis of the second elongated hole extends substantially in the horizontal direction; and
   a major axis of the first elongated hole extends in a direction substantially orthogonal to the major axis of the second elongated hole as viewed from an axial direction of the shaft when the door is closed.

2. The image forming device according to claim 1, further comprising a guide member that guides conveyance of the recording medium, the guide member being supported by the door at a position between the first predetermined position and the second predetermined position.

3. The image forming device according to claim 1, further comprising a lock mechanism that maintains a closed state of the door, the lock mechanism being disposed on the opposite side of the second predetermined position from the hinge mechanism,
   wherein the lock mechanism includes:
      a hook-like engaging arm provided to one of the door and the main body so as to extend from the one of the door and the main body toward the other one of the door and the main body, the engaging arm having a convex portion with an inclined surface that inclines with respect to the vertical direction;
      an engaging protrusion provided to the other one of the door and the main body, the engaging protrusion contacting the inclined surface of the convex portion, thereby engaging with the engaging arm; and
      the biasing member that biases at least one of the engaging arm and the engaging protrusion in a direction to increase a pressure to a contact area of the inclined surface with the engaging protrusion,
   wherein the biasing member generates a force at the contact area of the inclined surface with the engaging protrusion, the force biasing the door in a direction to increase the pressure to the predetermined positions of the door with the first to third positioning members.

4. The image forming device according to claim 1, wherein the biasing member is attached to the hinge mechanism, the biasing member biasing the door toward the main body, thereby increasing the pressure to the predetermined positions of the door with the first and second positioning members.

5. The image forming device according to claim 1, wherein rigidity of the door is lower than rigidity of the main body.

6. The image forming device according to claim 1, wherein the main body includes a frame that supports the image forming unit and a casing that covers the frame, and the first to third positioning members are provided to the frame.

7. The image forming device according to claim 1, further comprising a first roller rotatably supported in the main body and a second roller rotatably supported in the door, wherein the first roller contacts the second roller and conveys the recording medium in cooperation with the second roller when the door is closed.

* * * * *